United States Patent
Rothenberg et al.

(10) Patent No.: US 7,120,175 B2
(45) Date of Patent: Oct. 10, 2006

(54) SCALABLE HARMONIC LASER SOURCE AND METHOD

(75) Inventors: Joshua E. Rothenberg, Los Angeles, CA (US); Eric C. T. Cheung, Torrance, CA (US); Hiroshi Komine, Torrance, CA (US); Robert R. Rice, Simi Valley, CA (US); Michael G. Wickham, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 251 days.

(21) Appl. No.: 10/761,747

(22) Filed: Jan. 20, 2004

(65) Prior Publication Data

US 2005/0157761 A1    Jul. 21, 2005

(51) Int. Cl.
*H01S 3/10* (2006.01)
(52) U.S. Cl. .................................. 372/22; 372/6
(58) Field of Classification Search ............ 372/22
See application file for complete search history.

(56) References Cited

U.S. PATENT DOCUMENTS

| | | | |
|---|---|---|---|
| 5,111,468 A | 5/1992 | Kozlovsky et al. | 372/32 |
| 5,694,408 A | 12/1997 | Bott et al. | 372/6 |
| 5,832,006 A * | 11/1998 | Rice et al. | 372/3 |
| 6,061,170 A | 5/2000 | Rice et al. | 359/341 |
| 6,147,755 A | 11/2000 | Heflinger et al. | 356/349 |
| 6,229,616 B1 | 5/2001 | Brosnan et al. | 356/484 |
| 6,243,168 B1 | 6/2001 | Heflinger et al. | 356/486 |
| 6,366,356 B1 | 4/2002 | Brosnan et al. | 356/477 |
| 6,417,954 B1 | 7/2002 | Reynolds et al. | 359/330 |

FOREIGN PATENT DOCUMENTS

| | | |
|---|---|---|
| EP | 1 241 745 A | 9/2002 |
| FR | 2 834 136 A | 6/2003 |

OTHER PUBLICATIONS

Anderegg J et al: "8-Watt Coherently Phased 4-Element Fiber Array"; Proceedings of the SPIE, Bellingham, VA, US col. 4974, Jul. 2003, pp. 1-6, XP 002334462, ISSN: 0277-786X, Fig. 1.
International Search Report for corresponding PCT/US2005/000754, completed Feb. 27, 2006, mailed Mar. 8, 2006 Authorized Officer—L. Claessen of the EPO.

* cited by examiner

*Primary Examiner*—Armando Rodriguez
*Assistant Examiner*—Dung Nguyen
(74) *Attorney, Agent, or Firm*—Tarolli, Sundheim, Covell & Tummino LLP

(57) ABSTRACT

A laser array architecture scalable to very high powers by closely stacking fiber amplifiers, but in which the output wavelength is selectable to be in the visible or ultraviolet region, without being restricted by the wavelengths usually inherent in the choice of fiber materials. A pump signal at a fundamental frequency is amplified in the fiber amplifier array and input to an array of nonlinear crystals that function as harmonic generators, producing an output array at a desired harmonic of the fundamental frequency. A phase detection and correction system maintains the array of outputs in phase coherency, resulting in a high power output with high beam quality, at the desired frequency. The array of nonlinear crystals may a single array to produce a second harmonic output frequency, or a combination of multiple cascaded arrays configured to produce a selected higher order harmonic frequency.

10 Claims, 2 Drawing Sheets

SCALABLE HARMONIC LASER SOURCE AND METHOD

BACKGROUND OF THE INVENTION

This invention relates generally to high power laser sources and, more particularly, to high power laser sources providing output at visible or ultraviolet wavelengths. These laser sources are needed for a variety of applications, both military and commercial, but prior art sources have wavelengths restricted by the gain bandwidth of rare earth dopants used in fiber amplifiers cores.

In a typical prior art approach, output from a master oscillator (MO) is distributed to an array of high power fiber amplifiers pumped by laser diode arrays. The output beams from the fiber amplifiers are combined in a closely packed lens array to form the output beam. A sample of the output beam from each fiber is compared, on a detector array, to a frequency shifted reference wavefront derived from the MO, to provide a measurement of the instantaneous phase of each fiber amplifier in the array, and the phases are then corrected in real time to form the output beam. The output from the MO defines the spectrum and modulation waveform input to the amplifiers. A critical limitation is that the wavelength of operation is restricted by the gain bandwidth of the rare earth dopant used in the core of the fiber amplifiers. For the most efficient designs this wavelength happens to fall in the region of 1000 nm to 1100 nm using ytterbium (Yb) as the dopant. Unfortunately, this spectral region is not one that is always needed for high power laser applications, some of which call for output in the visible or the ultraviolet region of the spectrum.

The basic architecture of which the present invention is an improvement, is described in various prior patents, notably U.S. Pat. No. 5,694,408 to Bott et al., "Fiber Optic Laser System and Associated Lasing Method." The present invention also utilizes a prior art technique for beam formation and phase control, as described in four other patents: U.S. Pat. No. 6,147,755 to Heflinger et al., "Dynamic Optical Phase State Detector," U.S. Pat. No. 6,229,616 to Brosnan et al., "Heterodyne Wavefront Sensor," U.S. Pat. No. 6,243,168 to Heflinger et al., "Dynamic Optical Micrometer," and U.S. Pat. No. 6,366,356 to Brosnan et al., "High Average Power Fiber Laser System with High-Speed, Parallel Wavefront Sensor."

As discussed in more detail below, the present invention employs harmonic generation properties of nonlinear crystals. These properties are generally known in the art, as described, for example, in U.S. Pat. No. 5,111,468 to Kozlovsky et al., "Diode Laser Frequency Doubling Using Nonlinear Crystal Resonator with Electronic Resonance Locking," and U.S. Pat. No. 6,417,954 to Reynolds et al., "Nonlinear Optical Borates Materials Useful for Optical Frequency Conversion." To the extent needed to provide a complete disclosure, the patents listed in this paragraph and the immediately preceding paragraph are incorporated by reference into this document.

It will be appreciated from the foregoing, that there is a need for a laser source that is both scalable to high powers and is operable at a selected shorter wavelength that is not restricted by the properties of dopants used in fiber amplifiers. The present invention satisfies this need and provides other advantages over the prior art.

SUMMARY OF THE INVENTION

The present invention resides in a scalable high power laser source of which the output wavelength can be shifted to a desired region, such as the visible or ultraviolet regions of the spectrum. Briefly, and in general terms, the invention is embodied in a laser array architecture comprising an array of laser fiber amplifiers; a master oscillator generating a pump signal at a fundamental frequency; means for coupling the pump signal into each of the laser fiber amplifiers; at least one array of nonlinear crystals functioning as harmonic generators; and means for coupling amplified pump signals from the laser fiber amplifiers into respective nonlinear crystals, which generate an array of output sub-beams at a desired harmonic frequency. The laser array architecture further comprises means for detecting phase differences in the output sub-beams, and a plurality of phase modulators for adjusting the phases of the laser amplifier input signals in response to the detected phase differences, resulting in phase coherency among the output sub-beams.

The at least one array of nonlinear crystals may be a single array functioning as second harmonic generators (SHGs), providing an output at the second harmonic frequency. Alternatively, the at least one array of nonlinear crystals may comprise multiple cascaded arrays, configured as desired to provide a selected higher order harmonic of the fundamental frequency. For example, a second cascaded array of nonlinear crystals may be a second set of second harmonic generators, giving a fourth-harmonic output. In an alternate embodiment of the invention, a second cascaded array of nonlinear crystals function as a sum frequency generators, mixing the second harmonic with the fundamental to provide an output at the third-harmonic frequency. Other combinations of cascaded second harmonic generators and sum frequency generators can be used to generate output at a desired harmonic frequency.

The present invention may also be defined as a novel method for generating, from an array of laser fiber amplifiers, a high power coherent output beam at a desired wavelength in the visible or ultraviolet regions of the spectrum. Briefly, the method comprises the steps of generating in a master oscillator a pump signal at a fundamental frequency; coupling the pump signal to each of element of the array of fiber amplifiers; coupling the amplified pump signal from the array of fiber amplifiers into corresponding elements of an array of nonlinear crystals functioning as harmonic generators; and generating in each element of the array of nonlinear crystals an output signal with a frequency that is a desired harmonic of the fundamental frequency, to provide an array of output sub-beams. The method further comprises the steps of detecting phase differences in the output sub-beams, and adjusting the phases of the laser amplifier input signals in response to the detected phase differences, ensure phase coherence among the output sub-beams.

It will be appreciated from the foregoing summary that the present invention represents a significant advance in the field of high power lasers. The invention provides a laser source and method for generating a coherent high brightness output that is readily scalable to high powers and has a wavelength that may be designed to be in the visible or ultraviolet regions, without being subject to the wavelength limitations usually imposed by the inherent wavelength properties of fiber amplifier cores materials. In particular, the invention provides for the generation of a coherent high power beam at a selected harmonic frequency. Other aspects and advantages of the invention will become apparent from the following more detailed description of the invention, taken in conjunction with the accompanying drawings.

DETAILED DESCRIPTION OF THE INVENTION

Figure 1:
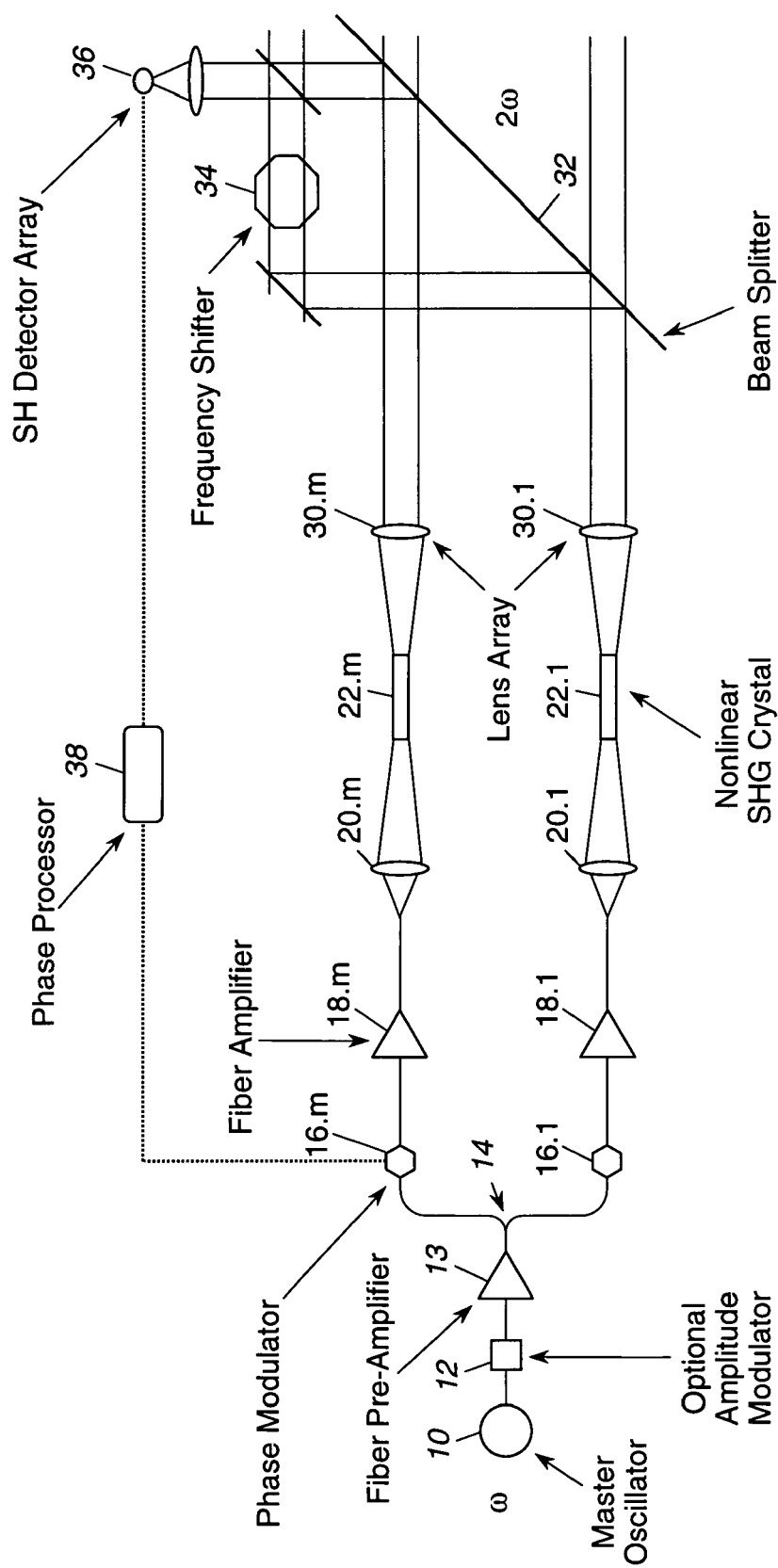
FIG. 1 is a schematic view of a scalable frequency doubled laser array architecture in accordance with the invention.

As shown in the drawings for purposes of illustration, the present invention is concerned with a laser fiber amplifier array architecture that is both scalable to high powers and of which the output frequency has a harmonic relationship with the fiber amplifier frequency. Therefore, the output is selectable to be in the visible or ultraviolet regions of the spectrum, independent of constraints normally imposed by properties of rare earth elements used in the fiber amplifiers. In the past, arrays of fiber amplifiers have produced outputs that, although scalable to higher powers, have been restricted in wavelength by the gain bandwidth inherently associated with the fiber core materials. For most efficient designs, this gain bandwidth falls in the region 1000 nm to 1100 nm, which is unfortunately not a desirable wavelength range for some applications of high power laser sources.

In accordance with the invention, an array architecture is configured to provide output at a desired shorter wavelength that is not restricted by the fiber amplifier gain bandwidth. The output is readily scalable to high powers without adversely affecting the efficiency of the device or the beam quality.

FIG. 1 shows the scalable array architecture harmonic laser array in accordance with the present invention. The architecture includes a single master oscillator (MO), indicated by reference numeral 10, an optional amplitude modulator 12, and a fiber preamplifier 13, providing a pump radiation source at a fundamental frequency. The pump signal is split along multiple paths, as indicated diagrammatically at 14, only two of which are shown. The pump signal in each path is processed by a phase modulator (16.1 through 16.$m$) and input to one member of a fiber amplifier array (18.1 through 18.$m$). The amplified pump signals are focused by appropriate lenses (20.1 through 20.$m$) into an array of nonlinear crystals (22.1 through 22.$m$), which perform the function as second harmonic generators (SHGs).

The array of SHG crystals (22.1 through 22.$m$) produces an array of m output signals at the second harmonic frequency $2\omega$. Each of the output signals is collimated by a lens (30.1 through 30.$m$) and sampled by a beam splitter 32. The output from the first beam, or any selected beam, is used as a phase reference. This output is processed by an optoelectronic or acousto-optic modulator acting as a frequency shifter 34, in which the phase of the output signal is dithered by a periodic signal. The output of the frequency-shifted signal is then focused onto an detector array 36. The output of the mth beam is focused onto one element of the detector array and interfered with the frequency shifted signal. The resultant signals from the detector array are used in a phase processor 38 to generate phase control signals that are applied to the phase modulators 16.1 through 16.$m$. In effect, the first output beam is used as a reference beam and each of the other output beams (2 through m) is interfered with frequency shifted reference beam to generate a phase control signal that has the effect of rendering the output beam array coherent.

Each SHG device is fabricated using a nonlinear crystal such as periodically poled lithium niobate (PPLN), potassium titanium oxide sulfate (KTP), lithium tantalite (LN), beta barium borate (BBO), lithium triborate (LBO), or other poled or non-poled materials. Periodic poling allows phase matching to be achieved for nearly any fundamental and harmonic frequencies in this spectral region, and greatly reduces the angular sensitivity of phase matching. In FIG. 1, the fundamental at frequency $\omega$ is injected into the nonlinear SHG device, thereby determining the second harmonic frequency $2\omega$. The phase of the second harmonic is coherent with respect to the injected fundamental due to the nature of the nonlinear process. The optional amplitude modulator 12 may be used to enhance the peak power for given average power input. This may be desirable to increase the efficiency of the harmonic generation process.

Figure 2:
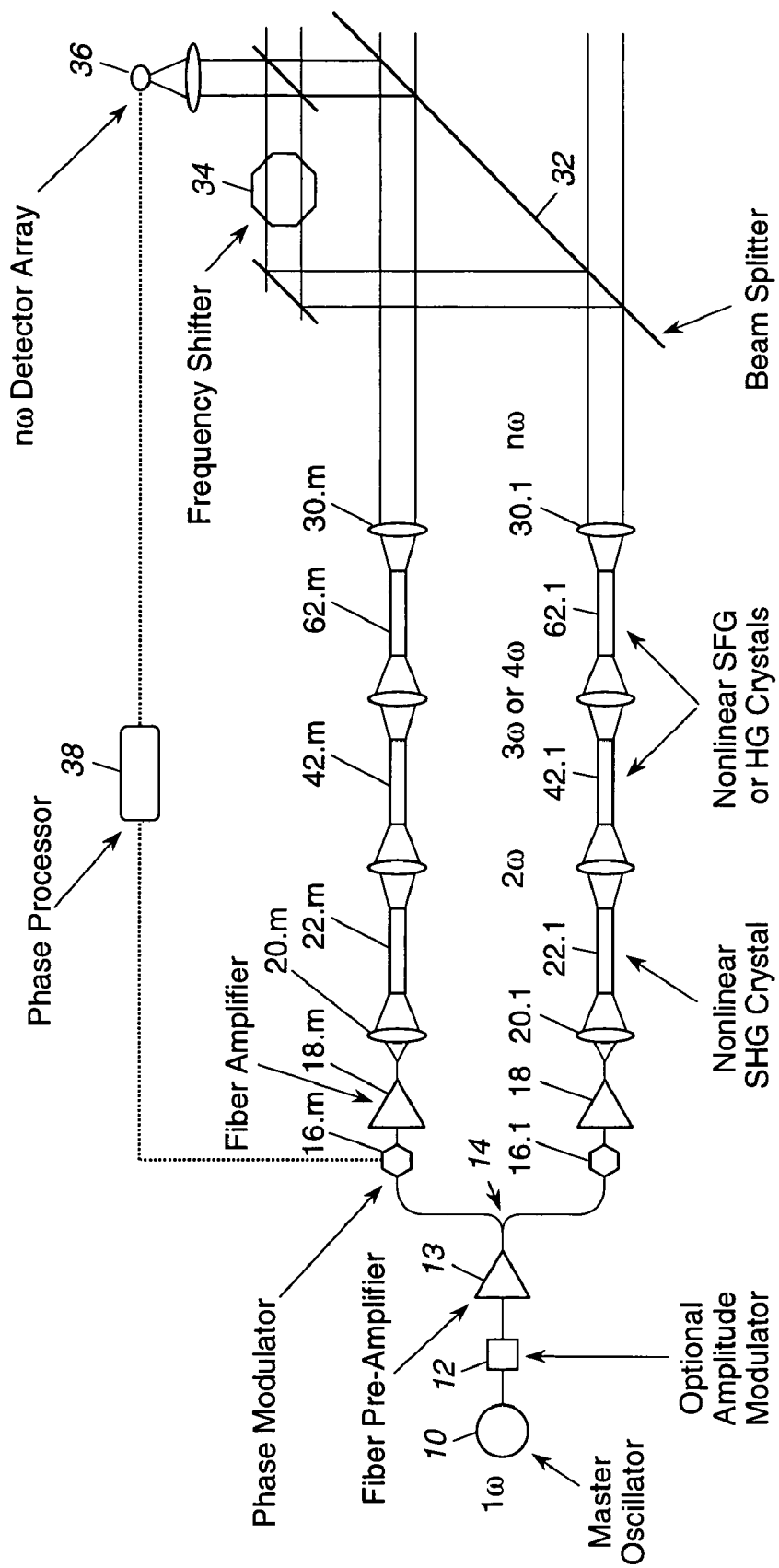
FIG. 2 is a schematic view of a scalable harmonic laser array in accordance with the invention.

The SHG process has extensions to higher harmonics by the inclusion of additional harmonic generator (HG) crystals as shown in FIG. 2. The generation of the higher harmonics is a cascade of conversion processes. For example, after generation of the second harmonic, an additional array of HG crystals (42.1 through 42.$m$) may be included to generate a cascaded second harmonic, which would be the fourth harmonic of the fundamental. Alternatively, after generation of the second harmonic in the crystals 22, the fundamental and the second harmonic could be mixed in the second array of crystals 42, operating as sum frequency generation (SFG) crystals to produce the third harmonic. A third cascaded array of crystals (62.1 through 62.$m$) can be used to produce additional harmonics. The final output from the cascaded nonlinear crystal arrays is an array of signals at a desired $n^{th}$ harmonic of the fundamental; that is, an output at a frequency $n\omega$. Such cascade processes can be used to generate any harmonic of the fundamental, although the efficiency becomes a more significant challenge as the number of cascaded processes increases. In all these processes, the phase of each final converted $n^{th}$ harmonic output in an array will be coherently controlled by the input phase of each corresponding fiber laser input. Therefore the entire $n^{th}$ harmonic array can be coherently combined in a manner similar to that described for generation of a second harmonic.

There is a requirement that the HG device be transparent at the relevant harmonic frequencies to enable efficient conversion and avoid excessive heat dissipation in the crystal. A number of materials such as periodically poled lithium niobate (PPLN), periodically poled potassium titanium oxide sulfate (PPKTP), and periodically poled lithium tantalite (PPLT), have transparency into much of the visible spectrum. In the ultraviolet (UV) region, the available list of materials is more limited and includes crystals such as potassium dihydrogen phosphate (KDP), beta barium borate (BBO), lithium triborate (LBO) and cesium lithium borate (CLBO). Poling of these materials may or may not be possible. Although poling is not essential to the operation of the invention, it can significantly improve the conversion efficiency.

In brief, the laser source harmonic array architecture of FIGS. 1 and 2 is readily scalable to very high powers by including large numbers of elements in the arrays of amplifiers 16, crystals 22 and associated optical elements. Output beam coherence is maintained by interfering a selected reference beam with every other beam and continuously adjusting the phase of the pump signal to compensate for any detected discrepancy. The output frequency or wavelength is selected by selecting an appropriate combination of arrays of nonlinear crystals 22, 42, 62, to provide an output that is a desired harmonic of the fundamental frequency ω.

The possible applications of a high-power and efficient visible or UV source are numerous. Because fiber lasers offer the highest known efficiency for a laser source, they are attractive for a number of both commercial and government sector applications. In these applications the efficiency, reliability, compactness, and mechanical robustness of these fiber laser sources would appear to be compelling in the market place. One example of a potential application is as a replacement for krypton fluoride (KrF) gas lasers at 248 nm for UV lithography. The KrF laser is large, uses highly toxic fluorine gas, and requires considerable maintenance. In contrast, a fiber laser nonlinearly converted into this region of the UV would be highly attractive in this rather large commercial market. Similar comparisons exist for many other high power laser applications.

It will be appreciated from the foregoing that the present invention represents a significant advance in the field of high power lasers, providing an output beam that is readily scalable to higher powers and has a wavelength that is a selectable harmonic of the fundamental frequency, and without, therefore, being limited by the properties of the fiber amplifier core materials. It will also be appreciated that, although the invention has been described with reference to specific embodiments, various modifications may be made without departing from the spirit and scope of the invention. Accordingly, the invention should not be limited except as by the appended claims.

The invention claimed is:

1. A laser array architecture, comprising:
an array of laser fiber amplifiers;
a master oscillator generating a pump signal at a fundamental frequency;
means for coupling the pump signal into each of the laser fiber amplifiers;
at least one array of nonlinear crystals functioning as harmonic generators;
means for coupling amplified pump signals from the laser fiber amplifiers into respective nonlinear crystals, which generate an array of output sub-beams at a desired harmonic frequency
means for detecting phase differences in the output sub-beams comprising:
optical splitting means for obtaining a sample of each of the output sub-beams;
a frequency shifting device connected to vary the frequency of a selected one of the output sub-beam samples; and
a multi-element detector array, each element of which records the result of interfering one of the sub-beam samples with the selected frequency-shifted sample, and generates a phase difference signal;
wherein the selected output sub-beam is used as phase reference and the other sub-beams are adjusted to be phase coherent with the selected sub-beam; and
and a plurality of phase modulators for adjusting the phases of the laser amplifier input signals in response to the detected phase differences, resulting in phase coherency among the output sub-beams.

2. A laser array architecture as defined in claim 1, wherein:
the at least one array of nonlinear crystals comprises a single array of nonlinear crystals functioning as second harmonic generators (SHGs); and
the output sub-beams are at the second harmonic frequency.

3. A laser array architecture as defined in claim 1, wherein:
the at least one array of nonlinear crystals comprises a first array of nonlinear crystals functioning as second harmonic generators (SHGs) and an additional array of nonlinear crystals cascaded with the first array and also functioning as second harmonic generators (SHGs); and
the two cascaded arrays of SHGs produce an output with a fourth harmonic frequency.

4. A laser array architecture as defined in claim 1, wherein:
the at least one array of nonlinear linear crystals comprises a first array of nonlinear crystals functioning as second harmonic generators (SHGs) and an additional array of nonlinear crystals cascaded with the first array and functioning as sum frequency generators (SFGs) to mix the outputs of the first array with the fundamental frequency; and
the two cascaded arrays of SHGs produces an output with a third harmonic frequency.

5. A laser array architecture as defined in claim 1, wherein:
the at least one array of nonlinear crystals comprises a first array of nonlinear crystals functioning as second harmonic generators (SHGs) and at least one additional array of nonlinear crystals cascaded with the first array; and
the cascaded arrays of nonlinear crystals produce an output with a desired harmonic frequency.

6. A method for generating, from an array of laser fiber amplifiers, a high power coherent output beam at a desired wavelength in the visible or ultraviolet regions of the spectrum, the method comprising the steps of:
generating in a master oscillator a pump signal at a fundamental frequency;
coupling the pump signal to each of element of the array of fiber amplifiers;
coupling the amplified pump signal from the array of fiber amplifiers into corresponding elements of an array of nonlinear crystals functioning as harmonic generators;
generating in each element of the array of nonlinear crystals an output signal with a frequency that is a desired harmonic of the fundamental frequency, to provide an array of output sub-beams;
detecting phase differences in the output sub-beams comprising:
splitting off a sample of each of the output sub-beams;
frequency shifting a selected one of the output sub-beam samples; and
interfering each one of the sub-beam samples with the selected frequency-shifted sample in a detector array, to generate a phase difference signal;
wherein the selected output sub-beam is used as phase reference and the other sub-beams are adjusted to be phase coherent with the selected sub-beam; and
adjusting the phases of the laser amplifier input signals in response to the detected phase differences.

7. A method as defined in claim 6, wherein the step of generating output signals comprises:

generating output signals at a second harmonic frequency in an array of second harmonic generators (SHGs).

8. A method as defined in claim 6, wherein the step of generating output signals comprises:
generating output signals at a second harmonic frequency in a first array of nonlinear crystals, functioning as second harmonic generators (SHGs); and
generating output signals at a third harmonic frequency in a second array of nonlinear crystals cascaded with the first array and functioning as sum frequency generators (SFGs) to mix the second harmonic signals with the fundamental frequency.

9. A method as defined in claim 6, wherein the step of generating output signals comprises:
generating output signals at a second harmonic frequency in a first array of nonlinear crystals, functioning as second harmonic generators (SHGs); and
generating output signals at a fourth harmonic frequency in a second array of nonlinear crystals cascaded with the first array and functioning as second harmonic generators (SHGs).

10. A method as defined in claim 6, wherein the step of generating output signal employs multiple cascaded arrays of nonlinear crystals performing selected functions to produce an array of output sub-beams at the selected harmonic frequency.

* * * * *